United States Patent
Vella

(10) Patent No.: US 9,551,061 B2
(45) Date of Patent: Jan. 24, 2017

(54) IN-SITU TRIPLE JUNCTION FORMATION TO MAINTAIN ELECTRODE CONDUCTIVITY

(71) Applicant: E/G ELECTRO-GRAPH, INC., Vista, CA (US)

(72) Inventor: Michael Vella, San Leandro, CA (US)

(73) Assignee: E/G Electro-Graph Inc., Vista, CA (US)

( * ) Notice: Subject to any disclaimer, the term of this patent is extended or adjusted under 35 U.S.C. 154(b) by 0 days.

(21) Appl. No.: 14/921,611

(22) Filed: Oct. 23, 2015

(65) Prior Publication Data

US 2016/0115581 A1    Apr. 28, 2016

Related U.S. Application Data

(60) Provisional application No. 62/067,693, filed on Oct. 23, 2014.

(51) Int. Cl.
| | | |
|---|---|---|
| C23C 14/04 | (2006.01) | |
| H01B 13/34 | (2006.01) | |
| C23C 14/48 | (2006.01) | |
| H01B 5/14 | (2006.01) | |
| H01J 37/08 | (2006.01) | |

(52) U.S. Cl.
CPC ............. *C23C 14/048* (2013.01); *C23C 14/48* (2013.01); *H01B 5/14* (2013.01); *H01B 13/348* (2013.01); *H01J 37/08* (2013.01)

(58) Field of Classification Search
CPC ......... C23C 14/048; C23C 14/48; H01B 5/14; H01B 13/348
USPC ........................................ 174/126.1; 427/523
See application file for complete search history.

(56) References Cited

U.S. PATENT DOCUMENTS

| | | | | |
|---|---|---|---|---|
| 5,739,628 | A  * | 4/1998 | Takada ................... | H01J 3/022 313/309 |
| 2003/0136505 | A1 | 7/2003 | Wimmer et al. | |
| 2007/0069622 | A1 * | 3/2007 | Ohwada ................. | B82Y 10/00 313/310 |
| 2008/0315114 | A1 | 12/2008 | Chang et al. | |
| 2012/0252221 | A1 | 10/2012 | De Brabander et al. | |
| 2016/0118220 | A1 * | 4/2016 | Vella ...................... | H01J 37/30 134/1.2 |

* cited by examiner

*Primary Examiner* — Timothy Thompson
*Assistant Examiner* — Charles Pizzuto
(74) *Attorney, Agent, or Firm* — Laurence A. Greenberg; Werner H. Stemer; Ralph E. Locher

(57) ABSTRACT

In systems where insulating deposits form during normal operation, electrodes are configured so the deposits have the effect of creating in-situ triple junctions. These triple junctions enhance low level discharge activity to facilitate localized breakdown of the deposits and maintain electrode conductivity.

19 Claims, 3 Drawing Sheets

IN-SITU TRIPLE JUNCTION FORMATION TO MAINTAIN ELECTRODE CONDUCTIVITY

CROSS-REFERENCE TO RELATED APPLICATIONS

The present application claims benefit of co-pending Provisional Patent Application No. 62/067,693, filed on Oct. 23, 2014; that application being incorporated herein, by reference, in its entirety.

BACKGROUND OF THE INVENTION

Field of the Invention

The invention relates to the use of localized electric field enhancement and, more particularly, to the introduction of features designed to create in-situ triple junctions in systems where insulating deposits form as part of normal operation. Candidate conductors typically operate below the threshold for electrical breakdown in clean, ideal conditions. This allows for the degradation of voltage holding associated with the contamination expected in normal operation. Deposits can be a loose, unbound accumulation of material, such as, dust. Deposits can also take the form of an attached layer, or, be formed by chemical reaction. Examples where insulating deposits can form include corona rings, insulator gradient rings, and spark gaps exposed to contamination, such as, spark plugs. Electrodes in vacuum systems, such as, charged particle accelerators and plasma tools, are given special attention.

In liquid, gas, or vacuum environments, electrode contaminants can require maintenance, or, lead to high voltage breakdown. In semiconductor vacuum based manufacturing tools, such as, plasmas and ion beams, breakdowns can increase particle generation. On powered electrodes, hard power supply breakdowns (also called 'glitches'), can significantly increase particle generation. This is undesirable, as particles can cause yield loss in semiconductor manufacturing and, consequently, particle counts are routinely monitored. Tool qualification and continued operation requires maintaining particle counts below a maximum allowable tolerance. What is needed is a technology that can increase service life by maintaining threshold particle counts, which would increase service life and be economically desirable.

Electrodes, Insulators, and Triple Junctions:

Insulators are critical components of any electrical system, and mechanisms that cause insulator failure have been extensively studied. In vacuum, gas, or non-conducting liquid systems, the confluence of medium-metal-insulator is called a "triple junction" (or "triple point"). Electric field enhancement at vacuum triple junctions can cause of insulator breakdown. See, for example, Schächter, "Analytic expression for triple-point electron emission from an ideal edge", Appl. Phys. Lett. 72 (4), 26 Jan. 1998; Chung et al., "Configuration-dependent enhancements of electric fields near the quadruple and the triple junction", J. Vac. Sci. Tech. B28, C2A94, 2010; Stygar et al., "Improved design of a high-voltage vacuum-insulator interface", Phys. Rev. ST Accel Beams 8, 050401 (2005).

In vacuum, an acute angle of intersection between insulator and cathode on the vacuum side can create a mathematical electric field singularity at the cathode triple junction. Then, electron field emission can create a creeping discharge along the insulator surface, and lead to eventual failure. An obtuse angle between insulator and anode can create a mathematical singularity in the electric field at the anode triple junction, which can lead to bulk insulator breakdown. Referring now to FIG. 1, one goal of research and development, according to U.S. Patent Application Publication No. 2014/0184055, has been to increase insulator service life by designing for an obtuse vacuum side angle 10 at the cathode 12 triple junction and an acute angle θ at the anode 14 triple junction. Concern for triple junction field enhanced breakdown extends from macro to submicron feature size. See, for example, U.S. Pat. No. 5,739,628 to Takada.

Study of vacuum triple junction breakdown is often done with clean vacuum, without free charge or ionizing radiation. So, study of the effect of deposits in a beam or plasma environments is relatively limited. However, even conductive deposits on electrodes in an ion beam can reduce the breakdown voltage to a fraction of that for clean electrodes. See, for example, Vanderberg, et. al., "Evaluation of electrode materials for ion implanters", IEEE 0-7803-X/99, pp. 207-210.

The presence of plasma introduces multiple issues compared with clean vacuum. Plasma provides free charge (mostly electrons) and radiation, especially UV, which has sufficient energy for ionization. Even a diffuse plasma implies Debye shielding for features larger than 0.01 cm. Free charge and UV radiation are obviously detrimental to insulator integrity, but the effect of Debye shielding is less obvious. Plasma sheaths are dynamic, with extremely high fluctuating electric fields over small distances. More importantly, the conformal nature of the sheath effectively makes the time averaged sheath electric field orthogonal to the material boundary. For example, in the case of a positive plasma or beam potential, a grounded boundary is at cold cathode potential, with the plasma as anode. At a triple junction, this effectively reproduces the long discarded geometry of a triple junction insulator at 90 degrees to the anode.

Semiconductor plasma and beam systems can be dc, rf, and/or pulse powered. They are used for etching, cleaning, doping, and material deposition. Semiconductor processes can be particularly harsh, sometimes even including simultaneous refractory temperatures, oxidizing chemicals, and energetic particle bombardment. Electrodes can accumulate deposits as process by-products. Insulating deposits are particularly troublesome, especially in the presence of free charge or ionizing radiation.

Many systems have an intrinsic form of directionality. For large scale, high voltage systems exposed to atmosphere, this may be simply be gravity. Plasma and ion beam processes frequently rely on energetic particles. In this case, deposit formation can have directionality imparted by either the energetic particles, or, by material backscattered from the impact of energetic particles.

Transient, low current electrical breakdown activity is routinely present in systems with high electric field. In air or vacuum, this is called corona. Corona cleaning, or, plasma discharge cleaning, is well known, and has often been used as a conditioning process for high voltage electrodes. Transient activity can be monitored by fast tracking of electrode current or voltage. The definition of 'breakdown' is subjective, depending on system requirements. Some systems simply run until complete insulator failure. In other cases, the onset of transient discharges that exceed a current or voltage threshold triggers a power supply interruption to limit damage.

Description of the Related Art

A whole classes of industrial products, Siemens dielectric barrier discharges, make productive use of the properties of insulators on electrodes in plasma. See, for example, Kogelschatz et al., "Dielectric-Barrier Discharges. Principle and Applications", Journal de Physique IV, 1997, 07 (C4), pp. C4-47-C4-66.

Triple junction field enhancement has been productively extended to dielectric barrier discharge processes. See, for example PCT Application Publication No. WO 2004/026461 A1.

What is needed is a system, device and method for maintaining localized electrode surface conductivity and overall electrode functionality, while avoiding system breakdown thresholds. What is further needed is a system in which geometric shaped electrode features promote the formation of triple junctions that promote discharge activity that creates localized plasma cleaning of portions of the electrode surface.

BRIEF SUMMARY OF THE INVENTION

It is accordingly an object of the invention to shape electrode features so as to promote the formation of insulating deposits during normal operation to create in-situ triple junctions. Discharge activity around the triple junctions creates localized plasma cleaning, and thereby maintains localized electrode surface conductivity and overall electrode functionality. For applications, such as semiconductor manufacturing, where particle generation is an issue, another intended benefit is expected to be reduction of net particle generation over the service life.

Although the invention is illustrated and described herein as embodied in in-situ triple junction formation to maintain electrode conductivity, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

One goal of the present invention is to provide a system and method in which electrode features are shaped so that insulating deposits formed during normal operation create in-situ triple junctions. Discharge activity at the triple junctions thus effects localized plasma cleaning in the areas of the triple junctions, thereby maintaining localized electrode surface conductivity and overall electrode functionality. With careful design, the effective angle of insulating deposits can be made acute with respect to the cathode boundary. This geometry is damaging to the insulator, as described in U.S. Patent Application Publication No. 2014/0184055 to Lauer et al. However, such insulator damage is desirable for purposes of the present invention, to perform localized cleaning or removal of insulating deposits that naturally form on the electrode surface. For semiconductor applications, another specific benefit is intended to be reduction of net particle generation over the service life cycle of the device.

Figure 1:
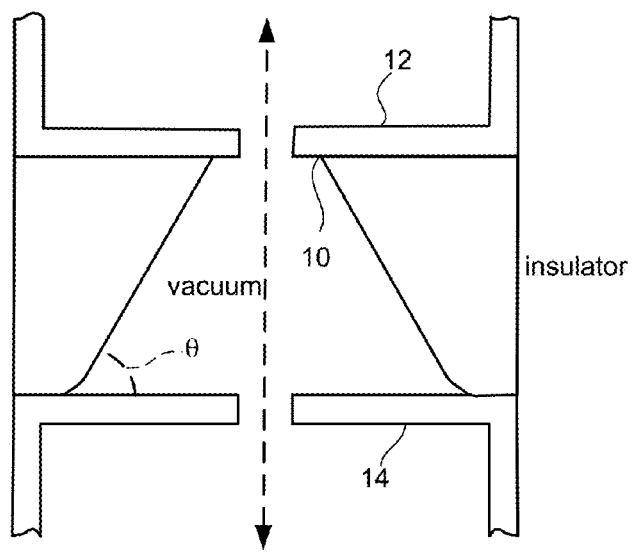
FIG. 1 is a cross-sectional view of a device having a dielectric body disposed between an anode and a cathode, in accordance with the prior art.
Figure 2:
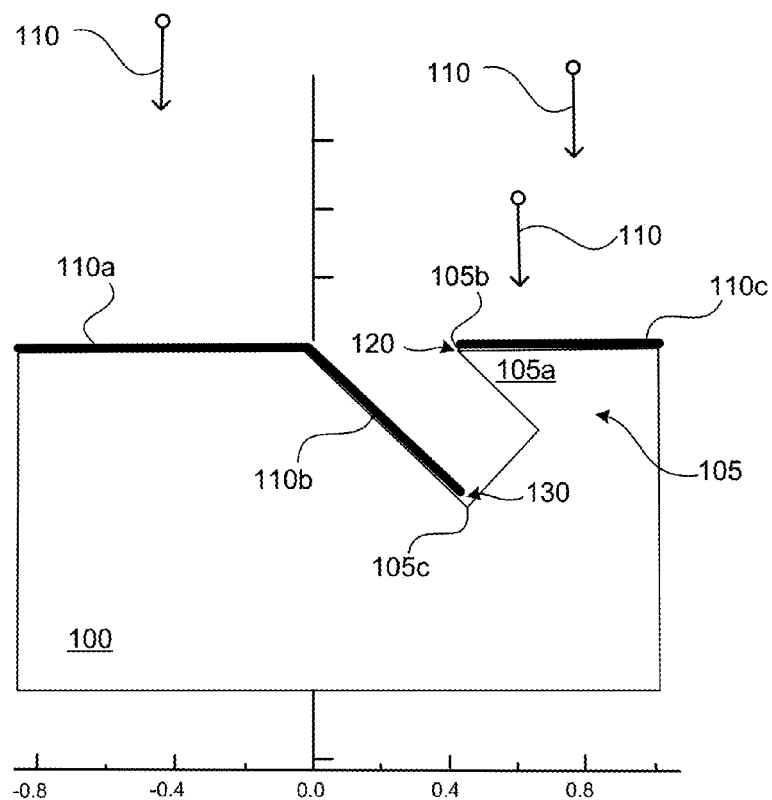
FIG. 2 is a simplified Illustration of a triple junction formed by insulating deposits that gravitationally accumulate in the shadow of a geometrically field enhanced top in accordance with one particular embodiment of the invention.

Referring now to FIG. 2, there is illustrated one particular embodiment of an electrode feature 105 that can be formed in the surface of an electrode 100, which is designed to take advantage of gravitational directionality. Falling, deposit forming particles 110 accumulate on an exposed portion of the electrode feature 105, but not in shadow portions of the feature 105a. More particularly, the feature 105 is shaped to include a geometrically field enhanced top portion 105a of the feature 105 configured to cause two triple junctions 120, 130 to form on the electrode surface. In other words, the feature 105 is formed with one portion 105a that overhangs or overshadows a portion of the electrode surface of another part of the feature 105. Consequently, although the upper surface of the one portion 105a is exposed to the deposit forming particles 110, the remainder of the one portion 105a is shaped to shield a portion of the electrode surface from the falling deposit forming matter 110. Thus, a layer 110c of the insulating deposits forms on the upper surface of the one portion 105a, but not on the electrode surface in the shadow of the one portion 105a.

In the embodiment of FIG. 2, one triple junction 120 forms near the field enhanced tip 105b of the feature 105a, while the second triple junction 130 forms on a plane below the tip 105b. Note that the insulator thickness 110a, 110b, 110c can be small relative to the feature size, so the thicknesses illustrated in FIG. 2 are intended for illustrative purposes, and not to scale. Also, note that insulator 110b is at an acute angle relative to an electric field between the bottom 105c of the feature 105 and the opposite polarity electrode, beam, or plasma above electrode 100. The triple junctions 120, 130 will produce a localized discharge activity that causes a localized breakdown of the deposits formed on the surface of the electrode 100 in the areas of the triple junctions 120, 130, thereby maintaining localized electrode surface conductivity. Additionally, the triple junctions are not formed prior to use, but rather, the present invention takes advantage of the deposits resulting on the electrode surface during normal use to form in-situ triple junctions.

As with all of the geometric features that will be described herein, the feature 105 may be formed in the electrode by molding, cutting, milling, machining, 3-D printing or the like. For purposes of the present application, the term "shadow" is used to denote an area of a feature that is blocked from having deposits formed thereon by the shape of the feature and the directionality of the particles that form the deposits. For example, in the embodiment of FIG. 2, the shadow portion of the feature 105 is that area blocked from receiving deposits that gravitationally accumulate (i.e., in a downward direction) by the top feature 105a. Similarly, in other embodiments described herein, the "shadow" area of the feature is created as a portion of the feature shielded from the directional flow of deposit forming particles by another portion of the feature in the path. See, for example, the embodiments of FIGS. 4 and 5. Thus, shadow triple junctions form at points on electrode surface in which shielded or shadow regions intersect with regions upon which insulating deposits have formed.

Figure 3A:
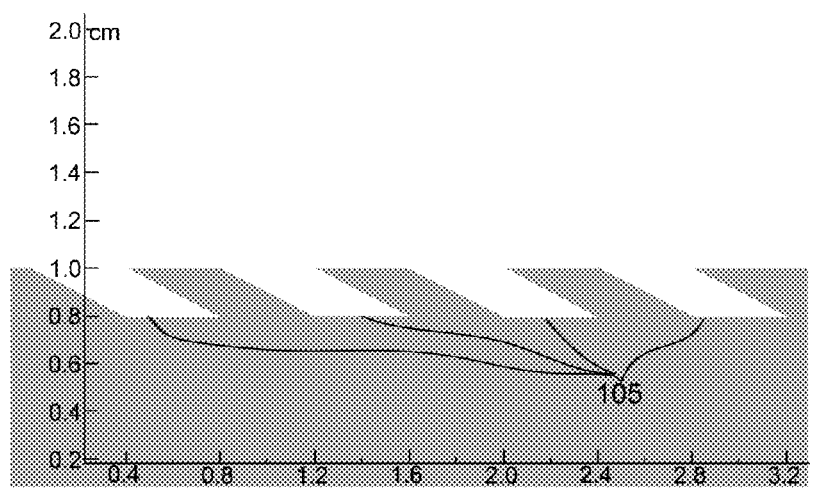
FIG. 3A is a simplified Illustration representing an array of electrode features in accordance with one particular embodiment, which is designed to form shadow triple junctions as an insulator coating accumulates.
Figure 3B:
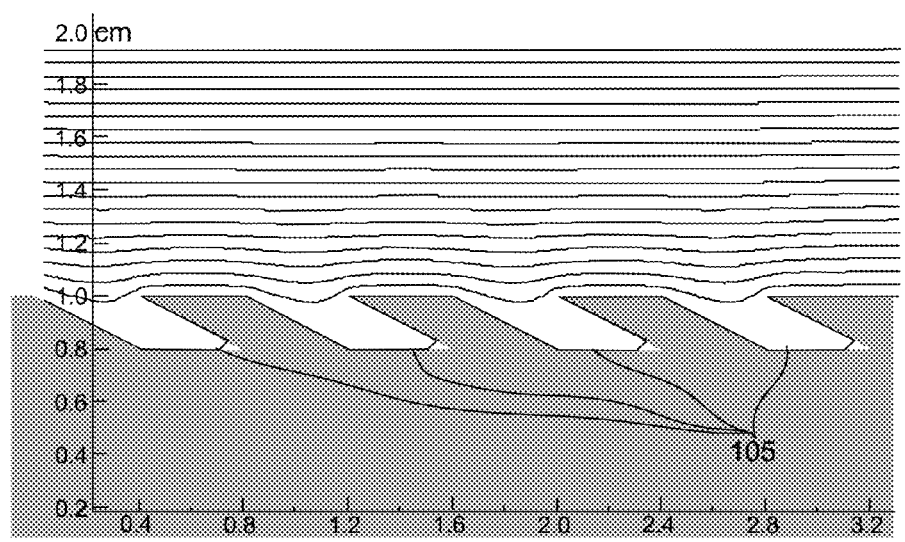
FIG. 3B is a graph illustrating the minimal impact an array of features, such as that of FIG. 3A, which is designed to create shadow triple junctions, has on simulated electrostatic potential contours between two electrodes.

Referring now to FIG. 3A, there is shown an array of electrode features 105 (i.e., which may be, for example, an array of the geometric features 105 of FIG. 2) that are designed to form shadow triple junctions as an insulator coating accumulates during normal electrode use. On a relative scale, similar features 105 could be embedded in any electrode. FIG. 3B shows a 2D electrostatic simulation for the electrode of FIG. 3A using a 10 kV, 1 cm planar electrode gap to illustrate that an array of the geometric features 105 has negligible effect on fields in the gap. In the illustrated simulation, the nominal increase in field strength is only 20%, and the effect disappears 10% of the distance into the gap. Similar to geometric field enhancement, the relative scaling of features is important for electrostatic fields, although important physical effects are sensitive to absolute scale.

Figure 4:
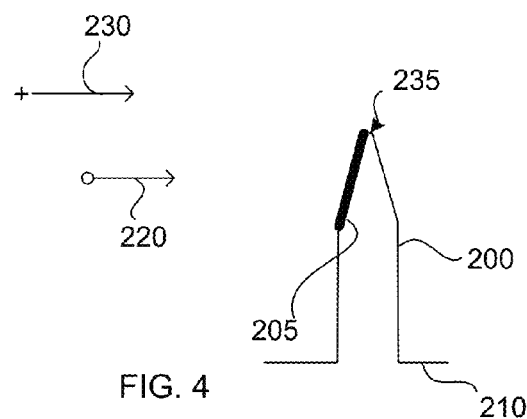
FIG. 4 is a simplified illustration of a single electrode fin orthogonal to insulating particles that are given directionality by energized charged particles to form a shadow triple junction useful in understanding the present invention.

Referring now to FIG. 4, there is shown one embodiment of a single electrode fin 200 formed on the surface of an electrode 210 orthogonal to insulating particles 220 that are given directionality by energized charged particles 230. Note that, although a single fin 200 is shown, an array of such fins can be formed on an electrode for the purposes of the present invention. More particularly, in a system with directionally energized ions, those ions have angular and energy dispersion. Via collisions with background gas, or, knockoff from surrounding walls, the energized ions create a dispersion of charged 230 and neutral 220 particles in same direction. If the energetic ions are poor elemental conductors, like silicon or boron, in situ triple junctions can be formed in the shadow (i.e., in this case, the angled face 205) of geometric features 200 designed for this purpose. In this case, the particle direction is shown orthogonal to the fin 200, and the triple junction 235 produces discharge activity that is additive to the corona activity due to the geometric field enhancement generated by the fin 200, itself, thus producing localized breakdown of the deposits formed thereon. The relative angle of the face 205 of the fin 200 can be adjusted as required for optimization, and, as discussed above, the idea can be extended to an array.

Figure 5:
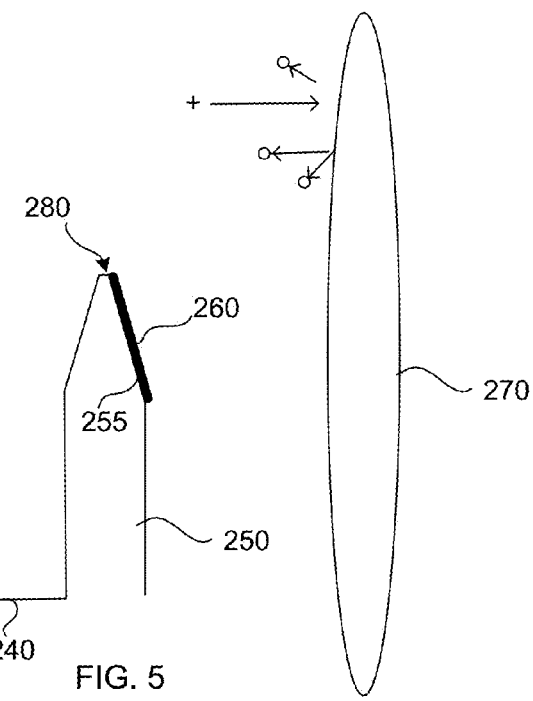
FIG. 5 is a simplified illustration of a single electrode fin showing the formation of a shadow triple junction by insulating material backscattered from a process surface, in accordance with one particular embodiment of the present invention.

FIG. 5 illustrates that backscatter from the impact of energetic particles can also be used to create shadow triple junctions on a geometric feature 250 designed for this purpose. In the particularly illustrated embodiment, the geometric feature 250 is a fin 250 or array of fins 250 that is provided on the surface of an electrode 240. Again, as with the previous embodiment, for purposes of illustrating the insulating layer 260 formed, the features are not to scale. In this case, the fin 250 is shown as parallel to the process surface 270, but the relative angle can obviously be adjusted to maximize benefit, and the idea can be extended to an array of fins 250. Thus, insulating material backscattered from the process surface 270 builds up on the angled face 255 of the feature 250, but not the other side (i.e., the shadow side), thus forming a triple junction 280. The triple junction 280 will encourage discharge activity that will clean the deposits from the tip of the feature 250. Additionally, the geometric feature, itself will produce a geometric field enhancement that results in corona activity at the tip, thus producing localized breakdown of the deposits formed thereon.

Figure 6:
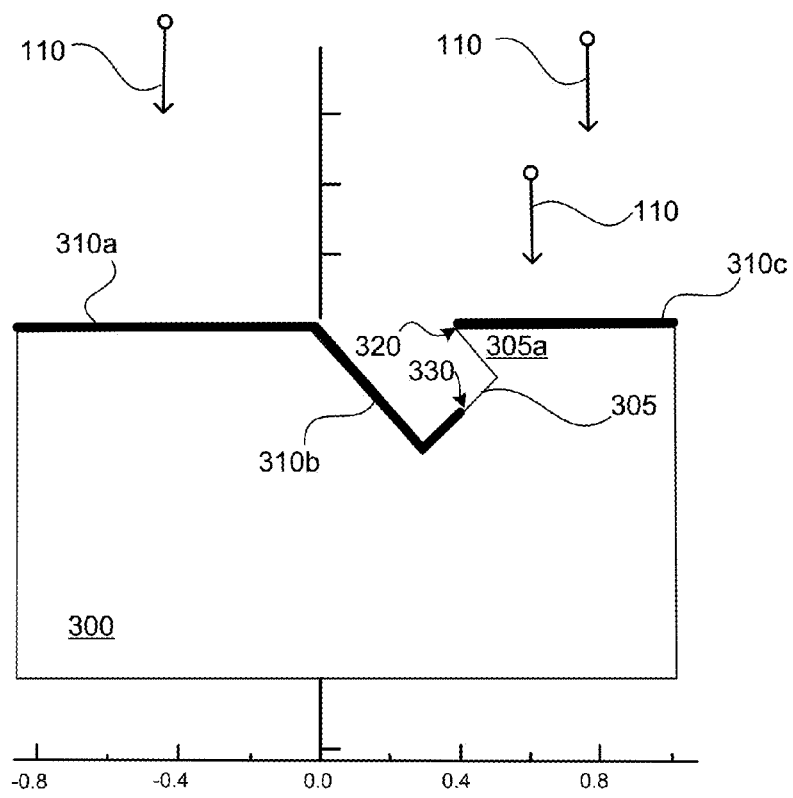
FIG. 6 is a simplified illustration of two proximate triple junctions formed by insulating deposits that gravitationally accumulate in the shadow of a geometrically enhanced field, in accordance with one embodiment of the present invention.

In systems with directionality, triple junction features can be located proximate to other triple junction features for the mutual benefit of discharge activity, as schematically illustrated in FIG. 6; in this case, directionality normal to the surface, e.g., gravitation. An electrode 300 is formed including one or more geometric features 305, the top feature 305a of which creates a shadow that protects a portion of the feature 305 from deposits particles 110. Thus, deposits 310a, 310b and 310c form on the surfaces of the electrode and in the portion of the feature not overshadowed by the top feature 305a. As the deposits form the insulating layer 310c, a shadow triple junction 320 forms on the backside of the top feature 305a, which has some geometric field enhancement. Similarly, as the deposits 110 form an insulating layer 310b, a second shadow planar triple junction 330 forms below the first shadow triple junction 320. The two triple junctions 320, 330 are close enough to one another to enhance the local discharge activity.

In anticipation of contamination, electrodes can be manufactured with features that promote the formation of triple junctions in-situ, in order to create localized cleaning discharge activity. Additional advantages can be obtained using known insulators with controlled dielectric and material properties.

Accordingly, the present embodiments of the invention relate to, among other things, the deliberate introduction of in situ triple junctions in systems where insulating deposits form during normal operation. The triple junctions thus created enhance low level discharge activity that facilitates localized breakdown of the deposits on the electrodes to maintain electrode conductivity. In semiconductor manufacturing tools, an expected benefit is net particle reduction While a preferred embodiment of the present invention is shown and described herein, it will be understood that the invention may be embodied otherwise than as herein specifically illustrated or described, and that within the embodiments certain changes in the detail and construction, as well as the arrangement of the parts, may be made without departing from the principles of the present invention as defined by the appended claims.

I claim:

1. A method of making an electrode, comprising the steps of:
   making a surface of the electrode include at least one geometric feature configured to generate at least one triple junction during use, the geometric feature including:
   a first surface portion configured for exposure to deposit forming particles in use; and
   a shadow surface portion shielded from exposure to said deposit forming particles in use, the shadow surface portion adjacent to the first surface portion.

2. The method of claim 1, wherein said at least one geometric feature is an array of geometric features, each including said first surface portion configured for exposure to said deposit forming particles in use and said shadow surface portion shielded from exposure to said deposit forming particles in use, the shadow surface portion adjacent to the first surface portion.

3. The method of claim 1, further comprising the steps of:
determining a directionality of said deposit forming particles in an environment in which the electrode is to be used; and
configuring the first surface portion to receive said deposit forming particles from the determined direction.

4. The method of claim 3, further comprising the steps of:
configuring the shadow surface portion such that it is shielded from said deposit forming particles from the determined direction by the first surface portion.

5. The method of claim 1, wherein the first surface portion is configured to shield the shadow surface portion from exposure to said deposit forming particles in use.

6. An electrode having a surface comprising:
at least one geometric feature configured to generate at least one triple junction during use, the geometric feature including:
a first surface portion configured for exposure to deposit forming particles in use; and
a shadow surface portion shielded from exposure to said deposit forming particles in use, the shadow surface portion adjacent to the first surface portion.

7. The electrode of claim 6, wherein the first surface portion is configured to shield the shadow surface portion from exposure to said deposit forming particles in use.

8. The electrode of claim 6, wherein the first surface portion is configured to receive deposit forming particles having a first directionality.

9. The electrode of claim 8, wherein the shadow surface portion is configured such that it is shielded from said deposit forming particles having the first directionality.

10. The electrode of claim 6, wherein the geometric feature is configured as a projection, with the first surface portion overshadowing the shadow surface portion.

11. The electrode of claim 10, wherein the geometric feature is configured to create two triple junctions in use, a first triple junction of said two triple junctions being formed below a tip of said projection formed by an intersection of said first surface portion and said shadow surface portion, and a second triple junction of said two triple junctions being formed on a plane below said tip.

12. The electrode of claim 11, wherein the geometric feature is configured to locate said first triple junction proximate to said second triple junction to enhance a low level discharge activity of said two triple junctions.

13. The electrode of claim 10, wherein said at least one geometric feature is an array of said at least one geometric features.

14. The electrode of claim 6, wherein the at least one geometric feature is at least one electrode fin configured to extend from the electrode orthogonal to a direction of insulating particles in use.

15. The electrode of claim 14, wherein the at least one electrode fin is an array of electrode fins.

16. A method of generating a localized breakdowns of deposits formed on a surface of an electrode, comprising the steps of:
providing an electrode having a surface including at least one geometric feature configured to generate at least one triple junction during use, the geometric feature including:
a first surface portion configured for exposure to deposit forming particles in use; and
a shadow surface portion shielded from exposure to said deposit forming particles in use, the shadow surface portion adjacent to the first surface portion;
orienting the electrode in a high voltage system with the first surface portion positioned for exposure to said deposit forming particles and said shadow surface portion shielded from exposure, based on a directionality of the deposit forming particles in said system in use;
forming deposits on said first surface portion in use, said deposits creating at least one triple junction at an interface between said deposits formed on said first surface portion and the electrode surface of said shadow surface portion; and
said at least one triple junction generating, when the system is in use, localized discharge activity to breakdown at least a portion of the deposits on said electrode.

17. The method of claim 16, wherein the at least one geometric feature is an array of the at least one geometric features.

18. The method of claim 16, wherein the geometric feature is configured to create two triple junctions in use, a first triple junction of the two triple junctions being formed below a tip of a projection formed by an intersection of the first surface portion and the shadow surface portion, and a second triple junction of the two triple junctions being formed on a plane below the tip.

19. The method of claim 16, wherein the at least one geometric feature is at least one electrode fin configured to extend from the electrode orthogonal to a direction of insulating particles when the system is in use.

* * * * *